United States Patent
Kornblit et al.

[11] Patent Number: 6,051,346
[45] Date of Patent: Apr. 18, 2000

[54] PROCESS FOR FABRICATING A LITHOGRAPHIC MASK

[75] Inventors: Avinoam Kornblit, Highland Park; James Alexander Liddle, Westfield; Anthony Edward Novembre, Martinsville, all of N.J.

[73] Assignee: Lucent Technologies Inc., Murray Hill, N.J.

[21] Appl. No.: 09/121,266

[22] Filed: Jul. 23, 1998

Related U.S. Application Data

[60] Provisional application No. 60/083,547, Apr. 29, 1998.

[51] Int. Cl.⁷ .................................................... G03F 9/00
[52] U.S. Cl. .................................................... 430/5
[58] Field of Search .............................. 430/5, 322, 296; 378/35

[56] References Cited

U.S. PATENT DOCUMENTS

| | | |
|---|---|---|
| 4,208,241 | 6/1980 | Harshbarger ............................ 156/643 |
| 5,079,112 | 1/1992 | Berger . |
| 5,130,213 | 7/1992 | Berger ........................................ 430/4 |
| 5,258,246 | 11/1993 | Berger ........................................ 430/4 |
| 5,260,151 | 11/1993 | Berger .................................... 430/396 |
| 5,316,879 | 5/1994 | Berger ........................................ 430/5 |
| 5,376,505 | 12/1994 | Berger .................................... 430/296 |
| 5,382,498 | 1/1995 | Berger .................................... 430/296 |
| 5,561,008 | 10/1996 | Berger ........................................ 430/4 |
| 5,733,688 | 3/1998 | Kato et al. .................................. 430/5 |
| 5,798,194 | 8/1998 | Nakasuji et al. ............................ 430/5 |
| 5,899,728 | 5/1999 | Mangat et al. .............................. 430/5 |

OTHER PUBLICATIONS

"Table 24 Product Critical Level Lithography Requirements", SIA Semiconductor Industry Association, *The National Technology Roadmap for Semiconductors*, p. 85.

*Primary Examiner*—S. Rosasco
*Attorney, Agent, or Firm*—Scott J. Rittman

[57] ABSTRACT

The invention provides an improved process for fabricating masks suitable for use in SCALPEL and similar electron-based or ion-based lithographic processes. Specifically, the process allows use of commercially-available (100) oriented silicon substrates, and better control over the profiles of mask struts. Specifically, the struts of the mask are formed by plasma etching, using a fluorine-based gas, and a unique multilayer mask blank is fabricated to promote successful use of the plasma etch. According to an embodiment of the process, an etch stop layer is deposited onto the front surface of a silicon substrate, and a membrane layer is deposited over the etch stop layer. A scattering layer, typically tungsten, is deposited over the membrane layer. A patterning layer is deposited on the back surface of the substrate, and the desired grillage pattern for the struts is patterned into the patterning layer. The grillage structure is then etched into the silicon, to form the struts, by plasma etching with the fluorine-based gas. The etch stop layer acts to prevent the etch from damaging the membrane layer.

14 Claims, 3 Drawing Sheets

PROCESS FOR FABRICATING A LITHOGRAPHIC MASK

CROSS-REFERENCE TO RELATED APPLICATION

This application claims priority of Provisional Application Ser. No. 60/083547 which was filed Apr. 29, 1998.

BACKGROUND OF THE INVENTION

1. Field of the Invention

The invention relates to fabrication of masks suitable for lithographic processes, particularly lithographic processes using an electron beam.

2. Discussion of the Related Art

In device processing, an energy sensitive material, called a resist, is coated onto a substrate, e.g., a silicon wafer which, depending on the state of completion of the device, possibly has overlying regions of semiconductor material, dielectric material, and/or electrically conductive material. Selected portions of the resist are exposed by irradiating the resist though a mask exhibiting a desired pattern, or the inverse of the desired pattern. The pattern is then developed in the resist, generally by immersing the resist in a solvent or by subjecting the resist to a plasma, to remove either the exposed or the unexposed regions. This pattern is then used as a mask, e.g., for etching the desired pattern into the underlying substrate, for performing ion implantation in the desired pattern, or for depositing a material in the desired pattern. Once the resist has served this patterning function, the resist is removed, a layer of material is typically deposited onto the patterned substrate, and the so-called lithographic process is repeated until the device is finished. The desire for ever-increasing miniaturization of devices on integrated circuits has resulted in the evolution of such lithographic processes to provide the requisite level of delineation. While exposure by near-UV rays offers useful results for the current generation of integrated circuits, it is expected that alternative radiation sources will be required for future generations. In this regard, some efforts have focused on the use of x-ray lithography, while others have focused on charged particles, e.g., electron or ion beam delineation.

From these efforts, electron beam lithography appears to be a useful tool for both the present and future fabrication of integrated circuits. However, it was found that conventional stencil or aperture masks, which expose the selected portions of a resist by absorbing portions of the electrons directed at the mask, imposed limitations on electron beam lithographic processes, e.g., due to heating of the absorbing areas, such heating causing mask deformation. An alternative to the conventional stencil or aperture mask was therefore developed, as discussed, for example, in U.S. Pat. Nos. 5,079,112, 5,130,213, 5,260,151, 5,376,505, 5,258,246, and 5,316,879, the disclosures of which are hereby incorporated by reference. The process of these patents, which is known as Scattering with Angular Limitation in Projection Electron-beam Lithography (SCALPEL), relies on a mask that scatters portions of the electrons directed at the mask such that the scattered electrons are capable of being directed at a substrate in a desired pattern. Improvements in the process have also been developed, as reflected, for example, in U.S. Pat. Nos. 5,382,498, and 5,561,008.

The basic features of a mask suitable for use in the process of these patents, or in similar processes based on electron or ion exposure, is shown in FIGS. 1 and 1A, and a schematic of one embodiment of the SCALPEL process is shown in FIG. 2. FIG. 1 shows a mask 10. The mask 10 is optionally supported by a ring 12 that is relatively rigid and heat-tolerant. As shown by the detailed view of FIG. 1A, the mask 10 contains a membrane 14 that is relatively transparent to electrons. The membrane 14 is attached to struts 16 that physically support the membrane 14 and reduce the physical effects of varying thermal and mechanical conditions. Skirts 18 are typically located on the top surface of the membrane 14 overlying the areas supported by the struts 16. (Alternatively, the skirts are located on a bottom surface of a membrane and struts are located on a top surface of the membrane.) The skirts 18 provide characteristics, e.g., substantially straight lines, useful when directing electrons through the mask during a lithographic process. The skirts 18 also prevent the electron beam from impinging on the struts 16, thereby reducing heating of the mask 10, as well as allow some tolerance of errors in placement of the struts 16 and control of the strut profile.

As shown in FIG. 2, the mask 10 is illuminated with electrons 22. Scattering areas 20 are present in a desired pattern on the membrane 14 of the mask 10, and act to scatter the electrons 22 passing through the mask 10. The skirts 18 similarly scatter the electrons 22 passing through the mask 10. (Scattered electrons 34 are also shown in FIG. 2.) Beams of electrons 30, 32 pass through individual segments of the membrane 14 relatively unscattered, the individual segments of the membrane 14 defined by the skirts 18. The unscattered electrons 30, 32 then move through an electromagnetic/electrostatic projector lens system 36, along with the scattered electrons 34. The projector lens system 36 causes the electrons 30, 32, 34 to converge. The optics of the apparatus are designed such that the unscattered electrons 30, 32 will pass through an aperture of a back focal plane filter 37, while the scattered electrons 34 are directed to a nontransparent region of the back focal plane filter 37. The electrons 30, 32 cross over each other as they pass through the aperture 36. Typically, a second projector lens system 38 brings the electrons of each beam 30, 32 into a parallel relationship, and the electron beams 30, 32 then expose the substrate 40 in a desired pattern.

For electron beams 32 that are not aligned with the optical axis of the apparatus, the second projector lens system 38 is also typically designed to redirect the electrons 32 to help compensate for gaps in the transmitted beams of electrons. In particular, as shown by FIG. 2, the presence of the struts 16 creates gaps between incoming groups of electron beams (e.g., beam groups 30, 32). In some situations, it is desirable to eliminate or reduce such a gap prior to the electrons impacting the substrate 40. Thus, as shown in FIG. 2, it is possible to configure the second projector lens system 38 to shift beam groups (e.g., beams 32) to compensate for this gap. In addition, it is possible to use other process parameters, e.g., relative movement of mask 10 and substrate 40, to contribute to this compensation, referred to as stitching. The design and presence of the skirts 18 generally also contributes to the gap compensation.

Clearly the structure of the mask plays an important role in SCALPEL and in similar electron-based or ion-based lithographic processes. The method of forming the mask, however, is exacting and time consuming—particularly forming the strut pattern such that the struts do not detrimentally affect the physical properties of the membrane and do not substantially interfere with the electron transmission, e.g., due to irregularities in shape of the struts. The process for forming masks is expected to become even more difficult as larger masks are developed. Improved methods for forming masks suitable for use in SCALPEL and similar systems are therefore desired.

SUMMARY OF THE INVENTION

The invention provides an improved mask suitable for use in SCALPEL and similar processes. The mask of the invention contains a membrane, typically silicon nitride, supported by silicon struts. The struts are formed by plasma etching of a silicon layer, using a fluorine-based gas such as $SF_6$ or $NF_3$, the plasma etching allowing formation of desired strut profiles. For example, the invention allows production of substantially vertical, rectangular struts in commercially available (and relatively inexpensive) (100) oriented silicon wafers. (Substantially vertical, rectangular struts indicates that, as reflected in FIG. 1A, the sides 17 of the struts 16 are perpendicular to the membrane 14 to within ±20°. (100) oriented indicates that the wafers are oriented with the (100) plane parallel to the surface of the wafer)

This ability to produced desired strut profiles in (100) silicon (or wafers of any other orientation) constitutes a significant improvement over masks made by present methods. Precise optical properties are clearly required in masks used in SCALPEL and similar processes, and mask properties are limited in part by the methods with which the supporting silicon struts are formed. Struts of irregular shape, for instance, take up an undesirably high amount of space in a mask and add complexity to the lithographic process. Yet, current fabrication methods typically produce such irregularly-shaped struts. For example, (100) oriented silicon wafers are typically used in mask blanks due to the wafers' wide commercial availability, and the (100) silicon wafers are generally wet etched in a conventional manner with KOH to provide struts. Yet, KOH etches silicon along the <111>direction, and the resultant struts in (100) silicon are thus trapezoidal-shaped. For the reasons above, trapezoidal-shaped struts are undesirable. One way in which such trapezoidal struts are avoided is to use (110) oriented silicon wafers instead of (100) silicon. However, such (110) oriented wafers are not widely available commercially, and their use is therefore not feasible due to the expense involved in obtaining custom made wafers. Moreover, while use of (110) oriented silicon in a wet etching process provides better control over strut profile, it is still difficult to form struts of a particularly desired shape with conventional wet etching, because KOH etches only along the <111>direction.

The invention, by plasma etching the silicon struts, allows much greater control of strut formation by allowing etching to be performed along any desired direction in silicon. Thus, it is possible to obtain desired strut profiles in commercially available (100) oriented silicon wafers, such as the substantially vertical-walled struts discussed previously. Gases containing fluorine-based compounds are particularly useful for etching silicon due to the high etch rates attained, e.g., advantageously at least 20,000 Å per minute. High density plasma etching, e.g., $\geq 10^{11}$ ions/cm$^3$ in the plasma, is particularly useful for attaining high etch rates.

Thus, the invention, through use of plasma etching with a fluorine-based compound, provides a mask having struts particularly useful for lithography. In particular, struts of nearly any desired profile are capable of being formed, and it is therefore possible to reduce the detrimental effects exhibited by struts of current masks.

DETAILED DESCRIPTION OF THE INVENTION

Figure 1:
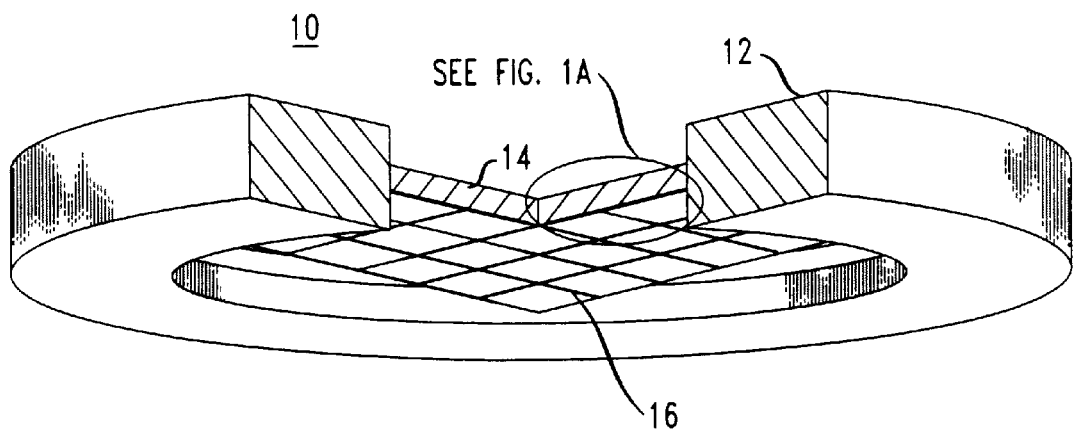
FIGS. 1 and 1A show a schematic of a mask suitable for use in SCALPEL or a similar process.
Figure 1A:
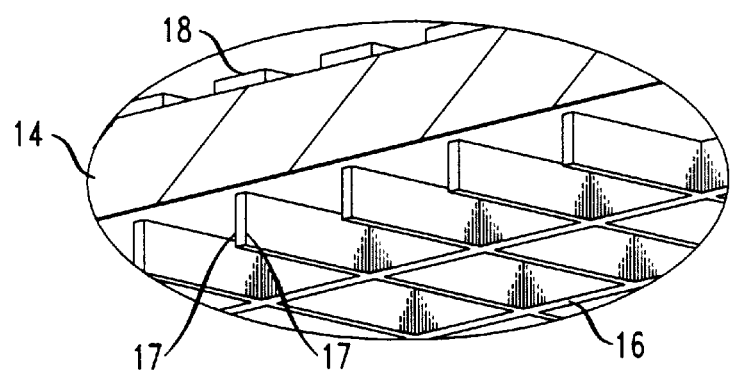
Figure 2:
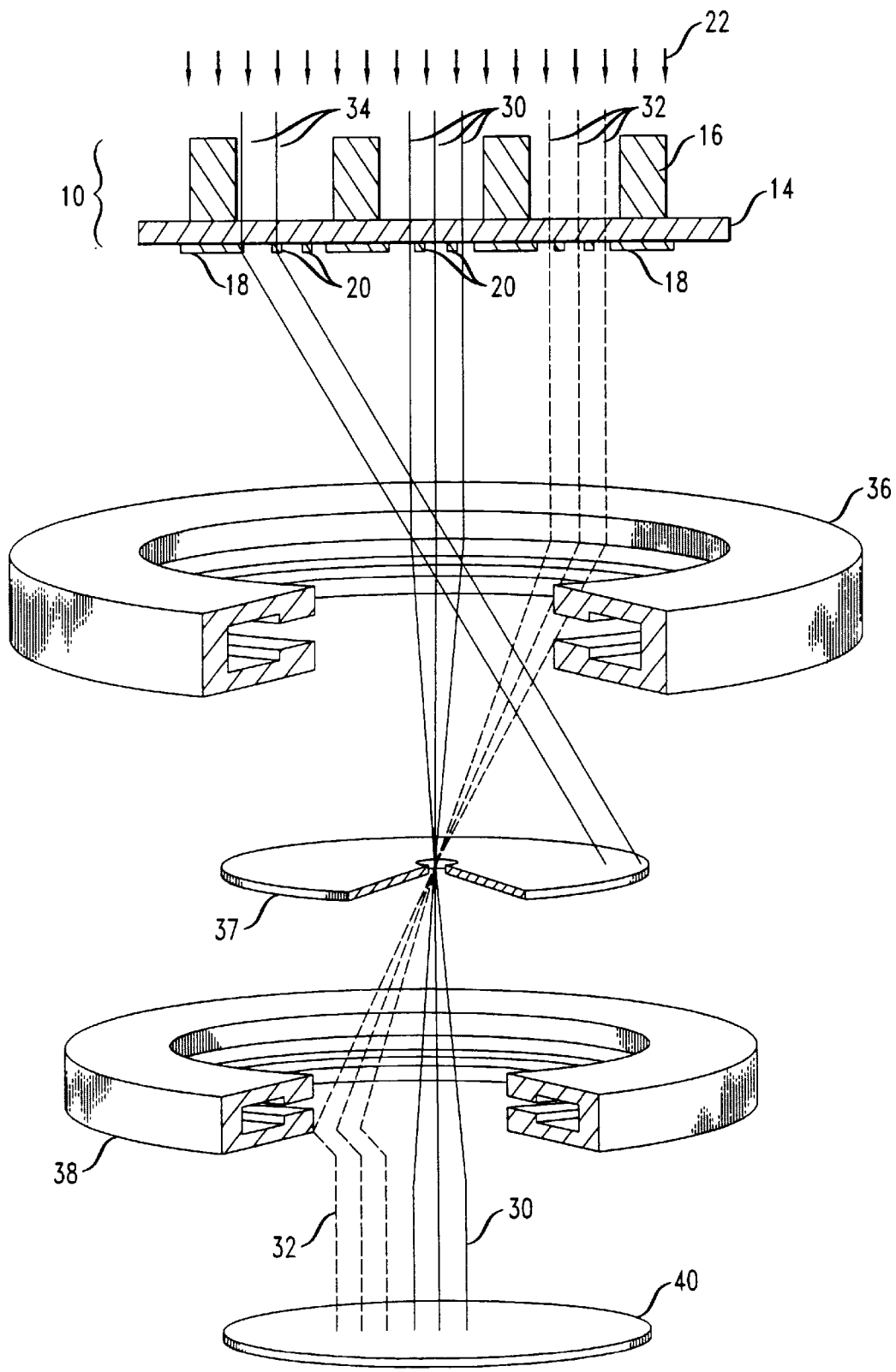
FIG. 2 shows a schematic of the SCALPEL process.

In an embodiment of the process, reflected in the cross-sectional schematics of FIGS. 3A–3D, a silicon substrate 40 (for forming the struts) is provided. (It is possible for the steps to be performed in an order different from that presented below, and for additional layers to be present.) The invention allows use of silicon oriented in any direction. Typically, a (100) oriented silicon substrate is used, because such substrates are readily available commercially. The substrate is typically about 250 to about 1000 μm thick.

A membrane layer 42 is deposited onto a first, i.e., top, surface of the silicon substrate 40. It is possible for the membrane layer 42 to be formed from any material that is substantially transparent to electrons and that provides the desired physical properties. (Substantially transparent to electrons indicates that a significant fraction, i.e., greater than 2% and typically up to about 50%, of the electrons pass through the layer without undergoing an unacceptable amount of elastic scattering.) Acceleration voltage and membrane layer thickness affect the transparency, in that higher acceleration voltage will result in a higher number of electrons passing through without elastic scattering, whereas a thicker membrane layer will reduce the number of such electrons. It is possible to adjust the acceleration voltage and thickness to allow a desired fraction of electrons to pass through the membrane without substantial elastic scattering. Examples of suitable materials for the membrane layer 42 include silicon, silicon nitride, silicon carbide, and diamond. The membrane layer 42 is typically formed from silicon nitride and has a thickness of about 500 to about 2000 Å. Below 500 Å, the membrane layer 42 is generally too fragile, and above 2000 Å, the number of unscattered electrons undesirably decreases. Normally, the membrane layer 42 is formed by low pressure chemical vapor deposition (LPCVD) of the silicon nitride, and the LPCVD typically results in simultaneous formation of a backside silicon nitride layer 44 onto the second, i.e., bottom, surface of the silicon substrate 40. (LPCVD is discussed, for example, in P. Van Zant, Microchip Fabrication, 3d Ed., McGraw-Hill, 1997, at 362–64.) It is possible, however, for the membrane layer 42 and backside layer 44 to be formed of different materials, or for the backside layer 44 to be absent. For example, it is possible for the backside layer 44 to be formed from silicon dioxide.

Optionally, an etch stop layer 46 is formed on the top surface of the silicon substrate 40, prior to formation of the membrane layer 42. The etch stop layer 46 acts to prevent the subsequent plasma etch from etching into the membrane layer 42. The etch stop layer 46 is typically formed from a material that (a) is substantially transparent to electrons (or is capable of being removed during mask formation), (b) is substantially non-reactive to plasma etching in fluorine-based gases, e.g., which does not typically form volatile fluorine products, and (c) has a low sputter yield under the etch conditions, i.e., the amount of atoms sputtered off the layer 46 during etching is within acceptable levels for the particular mask being fabricated. The etch stop layer is advantageously formed at a thickness that substantially avoids the presence of pinholes. Typically, the etch stop layer 46 is chromium, chromium oxide, silicon dioxide, or aluminum oxide. Where chromium is used, a thickness of greater than 100 Å is advantageous. (While silicon dioxide does form volatile products during a plasma etch, an etch stop layer of such an oxide is made thick enough to prevent the etch from passing through into the membrane layer 42.) In the case of a silicon dioxide etch stop layer, it is possible to start with a silicon substrate 40 having a silicon nitride layer on the substrate's second (i.e., bottom) surface, such that oxide growth will occur only on the top surface of the substrate 40. If the membrane layer 42 is then formed by LPCVD, further formation of silicon nitride will occur on the second surface of the substrate 40.

A patterning layer 50 is deposited over the backside layer 44 on the second surface of the silicon substrate 40 (or directly onto the silicon substrate 40 if no backside layer 44 is present). It is possible for the material of the patterning layer 50 to be deposited on both the first and second surfaces of the substrate 40, such as where it is desired to have a bi-metal scattering layer 48, as discussed below. The patterning layer 50 is typically formed from a material that (a) is substantially non-reactive to plasma etching in fluorine-based gases, e.g., which does not typically form volatile fluorine products, and (b) has a low sputter yield under the etch conditions. Thicknesses that reduce or avoid the presence of pinholes are advantageous. Typical thicknesses for the patterning layer 50 range from 100 Å to 2000 Å for typical materials such as titanium dioxide, chromium, oxides of chromium, and aluminum oxide. Thicknesses up to 60,000 Å are also possible, typically for materials such as polymeric resists or silicon dioxide. As reflected in FIG. 3B, at a subsequent stage, the desired grillage pattern for the struts is patterned into the patterning layer 50, e.g., by conventional photolithographic methods.

A scattering layer 48 is deposited over the membrane layer 42 (and over the etch stop layer 46, if present). The combination of layer 48 thickness, atomic number of the material, the voltage, and the aperture 37 size advantageously provides an aerial image with at least 90% contrast. It is possible to adjust these parameters, individually or in combination, to attain this contrast level. Materials having an atomic number greater than 40 are typically appropriate. The scattering layer 48 is typically formed from tungsten, or a bi-metal combination of tungsten and chromium (in which case, chromium is typically deposited as both the patterning layer 50 and the underlying layer of the bi-metal scattering layer 48). (Bi-metal combinations are useful for reducing stresses in the scattering layer 48.) The scattering layer 48 typically has a thickness of about 150 to about 750 Å. (After formation of the mask blank, the desired pattern for the integrated circuit chip, as well as the skirts, are formed in the scattering layer.) Optionally, a protective layer is deposited over the scattering layer 48 to protect the scattering layer 48 from inadvertent etching during the etch of the back side of the substrate 40, and also from damage caused by handling. A variety of materials are suitable for providing such protection, including metals and polymers. It is also possible to deposit a layer between the membrane layer 42 and the scattering layer 48 to protect the membrane layer 42 during formation, e.g., etching, of a pattern in the scattering layer 48.

Figure 3A:
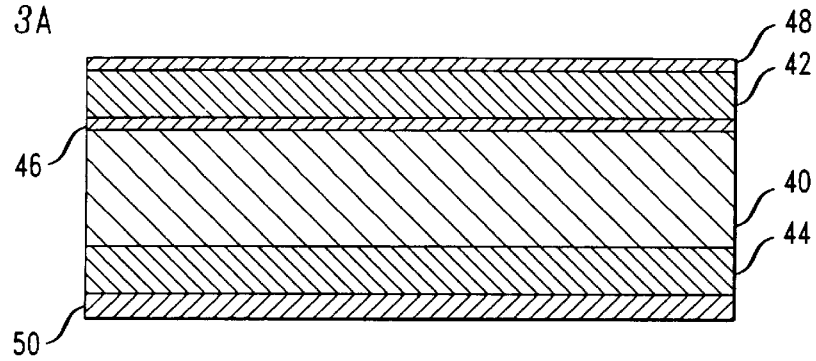
FIG. 3A–3D show the steps of an embodiment of the invention.
Figure 3B:
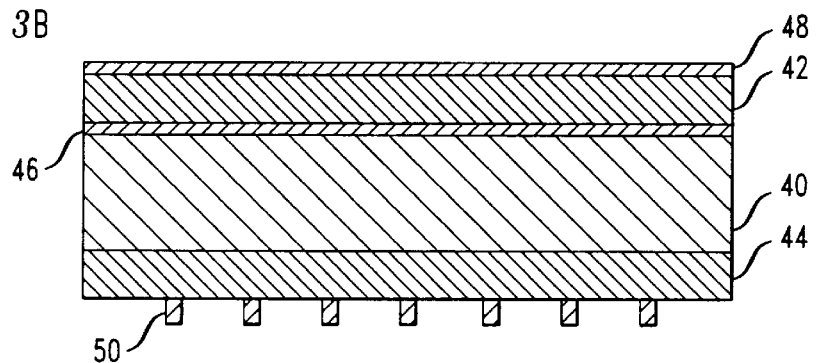
Figure 3C:
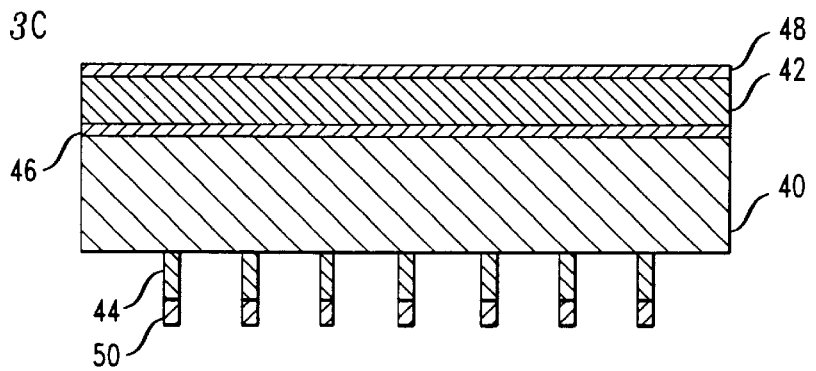
Figure 3D:
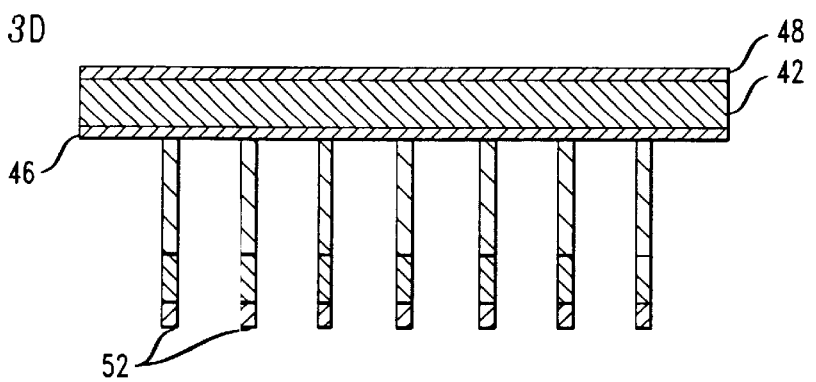

As reflected in FIG. 3C, through a patterned area of patterning layer 50, the backside layer 44 is etched away, by conventional wet or dry etching to expose portions of the underlying silicon substrate 40. Where the backside layer 44 is silicon nitride, a $CF_4/O_2$ plasma etch is useful. As shown in FIG. 3D, once the grillage pattern is etched into the backside layer 44, or where no backside layer 44 is present, the grillage structure is etched into the silicon 40 to form the struts 52, by plasma etching with the fluorine-based gas. Once the struts 52 are etched, the patterning layer 50 and backside layer 44 are optionally removed. The etch stop layer 46 is also optionally etched away to expose the membrane layer 42. The scattering layer 48 of the mask blank is then ready to be patterned, in order to form the skirts and the desired pattern for integrated circuit manufacture. To assist patterning, it is possible to deposit resist material on the front, i.e., top. surface of the substrate prior to etching the struts 52.

As stated above, the plasma etch is performed in a fluorine-based gas, which provides a useful etch rate. Plasma etching is discussed generally in Van Zant, *Microchip Fabrication*, 3d Ed., McGraw-Hill, 1997, and more specifically in M. Lieberman and A. Lichtenberg, *Principles of Plasma Discharges and Materials Processing*, John Wiley & Sons, 1994, the disclosures of which are hereby incorporated by reference. Examples of suitable gases include $SF_6$ and $NF_3$. Optionally, the gas contains an additional component for purposes of profile control, e.g. $Cl_2$, HBr, and $N_2$. (When these additional gases are included, the patterning layer is advantageously non-reactive to plasma etching in the gases.) Typically, the plasma etch is performed at a rate greater than 20,000 Å per minute, advantageously greater than 40,000 Å per minute, more advantageously greater than 80,000 Å per minute. High density plasma etching, e.g., $\geq 10^{11}$ ions/cm$^3$ in the plasma, is particularly useful for attaining these high etch rates. The rate also depends in part on the parameters of the plasma etch. Generally, the gas flow is about 40 to about 80 sccm. The pressure is generally about 30 to about 50 mTorr. The source power supplied is generally about 300 to about 600 W, and the bias power is generally greater than 0 to about 100 W, more typically about 50 W to about 100 W. A control sample is easily used to determine the parameters that produce a desired etch rate, for a given set of circumstances. It is possible for the plasma etch to be performed with conventional equipment, including reactive ion etch (RIE) equipment. For example, it is possible to use the process disclosed in U.S. Pat. No. 5,501,893 to Laerner et al., the disclosure of which is hereby incorporated by reference.

As fully discussed in U.S. Pat. No. 5,260,151, referenced previously, a variety of mask parameters have been found to be useful in processes such as SCALPEL. Examples of functional chip areas are given in the Semiconductor Industry Association (SIA) publication "The National Technology Roadmap for Semiconductors." For example, for a mask to wafer ratio of 4:1 (i.e., a reduction in size associated with the projection optics), the corresponding functional area of a mask formed according to the invention is typically about 25× larger, not simply 16x. The additional space is taken up by the supporting struts of the mask. The struts typically have a width (parallel to the mask surface) of 0.1 to 0.25 mm and a height (perpendicular to the mask surface) of 0.25 to 1.0 mm. It is possible for the segment spacing (i.e., from the center of one strut to the center of an adjacent strut) to be different in the two orthogonal directions, e.g., 0.5 to 2 mm in one direction and 1 to 200 mm in a direction orthogonal thereto. The spacings of the struts and their dimensions are typically adjusted to maintain mask pattern placement errors and contributions to feature variations within acceptable limits for a given application.

Other embodiments of the invention will be apparent to those skilled in the art from consideration of the specification and practice of the invention disclosed herein.

What is claimed is:

1. A process for forming a mask, comprising the steps of:
   providing a silicon substrate;
   depositing a membrane layer on a first surface of the substrate;
   depositing a scattering layer over the membrane layer;
   depositing a patterning layer on a second surface of the substrate;
   defining a pattern in the patterning layer; and
   etching a portion of a second surface of the silicon substrate by plasma etching with a gas comprising at least one fluorine-based gas.

2. The process of claim 1, wherein the silicon substrate is (100) oriented silicon.

3. The process of claim 2, wherein the etching step provides substantially vertical, rectangular struts.

4. The process of claim 1, wherein the fluorine-based gas is at least one of $SF_6$ and $NF_3$.

5. The process of claim 1, wherein the gas further comprises a gas selected from $Cl_2$, HBr, and $N_2$.

6. The process of claim 1, wherein the patterning layer comprises a material selected from titanium dioxide, chromium, oxides of chromium, and aluminum oxide.

7. The process of claim 1, wherein the scattering layer comprises tungsten.

8. The process of claim 1, further comprising the step of forming an etch stop layer directly on the first surface of the silicon substrate.

9. The process of claim 8, wherein the etch stop layer comprises a material selected from chromium and silicon dioxide.

10. The process of claim 1, further comprising the step of depositing a backside layer on the second surface of the substrate prior to depositing the patterning layer.

11. The process of claim 1, wherein the plasma etching is high density plasma etching.

12. The process of claim 11, wherein the plasma etch occurs at a rate greater than about 20,000 Å/minute.

13. The process of claim 12, wherein the plasma etch occurs at a rate greater than about 40,000 Å/minute.

14. A mask suitable for lithography, comprising:
    a membrane layer; and
    substantially vertical, rectangular struts supporting the membrane layer, the struts formed from (100) oriented silicon.

* * * * *